(12) United States Patent
Kakumoto et al.

(10) Patent No.: US 7,417,212 B2
(45) Date of Patent: Aug. 26, 2008

(54) SOLID-STATE IMAGE-SENSING DEVICE

(75) Inventors: Tomokazu Kakumoto, Nagaokakyo (JP); Kraisorn Throngnumchai, Yokohama (JP)

(73) Assignees: Konica Minolta Holdings, Inc., Tokyo (JP); Nissan Motor Co., Ltd., Yokohama-shi (JP)

( * ) Notice: Subject to any disclaimer, the term of this patent is extended or adjusted under 35 U.S.C. 154(b) by 12 days.

(21) Appl. No.: 11/393,429

(22) Filed: Mar. 30, 2006

(65) Prior Publication Data

US 2006/0233008 A1   Oct. 19, 2006

(30) Foreign Application Priority Data

Mar. 31, 2005   (JP)   ............... 2005-101362

(51) Int. Cl.
  *H01L 27/00*   (2006.01)
  *H04N 3/14*   (2006.01)
  *H04N 5/335*   (2006.01)

(52) U.S. Cl. ............. 250/208.1; 348/308; 348/294

(58) Field of Classification Search ........... 250/208.1; 348/294, 241, 243, 308; 257/290–294
See application file for complete search history.

(56) References Cited

U.S. PATENT DOCUMENTS

| | | | |
|---|---|---|---|
| 4,740,908 A | 4/1988 | Berger et al. | 364/829 |
| 5,812,703 A | 9/1998 | Juen et al. | 382/274 |
| 5,965,871 A * | 10/1999 | Zhou et al. | 250/208.1 |
| 6,473,124 B1 | 10/2002 | Panicacci et al. | 348/241 |
| 2001/0013571 A1 * | 8/2001 | Kakumoto et al. | 250/208.1 |
| 2001/0020672 A1 * | 9/2001 | Hagihara | 250/208.1 |
| 2004/0065804 A1 | 4/2004 | Kusuda | 250/208.1 |
| 2004/0125221 A1 | 7/2004 | Kakumoto | 348/243 |
| 2004/0227109 A1 | 11/2004 | Storm et al. | 250/551 |

FOREIGN PATENT DOCUMENTS

| | | |
|---|---|---|
| EP | 1 041 818 A2 | 10/2000 |
| EP | 1 187 217 A2 | 3/2002 |
| EP | 1187217 A2 | 3/2002 |
| EP | 1 349 377 A1 | 10/2003 |
| JP | 11-313257 A | 11/1999 |
| JP | 2000-28879 A | 1/2000 |

OTHER PUBLICATIONS

Chinese "Notice of Office Action" dated Feb. 29, 2008, for counterpart Chinese Application No. 200610073709.X; Together with an English-language translation thereof.

* cited by examiner

*Primary Examiner*—Georgia Y. Epps
*Assistant Examiner*—Jennifer Bennett
(74) *Attorney, Agent, or Firm*—Sidley Austin LLP (57) ABSTRACT

Solid-state image-sensing device for acquisition of sensed-image data is described. A photoelectric converter disconnecting switch is turned on to make a forcible reset switch perform resetting. Then, the logarithmic conversion MOS transistor is reset according to the threshold voltage thereof. Then, an output commensurate with the amount of light incident on the photoelectric converter is delivered. The photoelectric converter disconnecting switch is turned on to perform resetting and then turned off. Then, the voltage at the end of the logarithmic conversion MOS transistor that is not connected to the photoelectric converter disconnecting switch is reset according to its threshold voltage. This provides an output unrelated to the incident light. With this sequence of operations, variations in sensitivity among individual pixels can be corrected for without irradiation with uniform light.

3 Claims, 5 Drawing Sheets

SOLID-STATE IMAGE-SENSING DEVICE

This application is based on Japanese Patent Application No. 2005-101362 filed on Mar. 31, 2005, the contents of which are hereby incorporated by reference.

BACKGROUND OF THE INVENTION

1. Field of the Invention

The present invention relates to a solid-state image-sensing device in which variations in sensitivity among individual pixels are corrected for.

2. Description of Related Art

In recent years, in the field of solid-state image-sensing devices having photoelectric conversion elements such as photodiodes, there have been proposed solid-state image-sensing devices that output an electrical signal obtained by natural-logarithmically converting the amount of incident light (for example, see JP-A-H11-313257). In such logarithmic-conversion solid-state image-sensing devices, variations in threshold voltage among individual MOS transistors for logarithmic conversion produce variations in sensitivity among individual pixels, and eventually produce fixed-pattern noise components among pixels.

As an improvement, there have been proposed logarithmic-conversion solid-state image-sensing devices that use, as calibration noise data for correcting actually sensed images, sensed-image data obtained under irradiation with uniform light.

With these logarithmic-conversion solid-state image-sensing devices that use, as calibration noise data for correcting actually sensed images, sensed-image data obtained under irradiation with uniform light, however, the calibration noise data cannot be acquired by ordinary image sensing. Thus, to correct for variations in sensitivity among individual pixels on a real time basis, one frame worth of sensed-image data under irradiation with uniform light need to be acquired and stored in a frame memory. Moreover, variations in temperature and other conditions cause variations in sensitivity among individual pixels, and therefore, to correct for variations in sensitivity among individual pixels on a real time basis in the presence of variations in temperature and other conditions, sensed-image data obtained under irradiation with uniform light need to be previously acquired under different temperature and other conditions. Thus, to store sensed-image data obtained under different sets of conditions, the frame needs to be given a large capacity.

SUMMARY OF THE INVENTION object of the present invention is to provide a solid-state image-sensing device in which variations in sensitivity among individual pixels can be corrected for without irradiation with uniform light.

To achieve the above object, according to the present invention, a solid-state image-sensing device is provided with a pixel circuit, and this pixel circuit is provided with: a photoelectric converter; a logarithmic conversion MOS transistor that logarithmically converts the output of the photoelectric converter and that has the gate and drain thereof short-circuited together; a photoelectric converter disconnecting switch that is provided between the photoelectric converter and the logarithmic conversion MOS transistor; a forcible reset switch that, when turned on, resets the voltage at the node between the photoelectric converter and the photoelectric converter disconnecting switch; and a controller that turns on and off and thereby controls the photoelectric converter disconnecting switch and the forcible reset switch. Here, for acquisition of sensed-image data, the photoelectric converter disconnecting switch is turned on to make the forcible reset switch perform resetting, then the voltage at the end of the logarithmic conversion MOS transistor that is not connected to the photoelectric converter disconnecting switch is so controlled that the logarithmic conversion MOS transistor is reset according to the threshold voltage thereof, and then an output commensurate with the amount of light incident on the photoelectric converter is delivered. On the other hand, for acquisition of noise data, the photoelectric converter disconnecting switch is turned on to make the forcible reset switch perform resetting, then the photoelectric converter disconnecting switch is turned off, then the voltage at the end of the logarithmic conversion MOS transistor that is not connected to the photoelectric converter disconnecting switch is so controlled that the logarithmic conversion MOS transistor is reset according to the threshold voltage thereof, and then an output unrelated to the amount of light incident on the photoelectric converter is delivered.

With the solid-state image-sensing device configured as described above, when sensed-image data is acquired, an output commensurate with the amount of light incident on the photoelectric converter is obtained and, when noise data is acquired, an output unrelated to the amount of light incident on the photoelectric converter is obtained. Thus, by performing correction by using those data, it is possible to correct for variations in sensitivity among individual pixels without irradiation with uniform light. This eliminates the need to previously acquire calibration noise data. Moreover, even in the presence of variations in temperature and other conditions, calibration noise data can be acquired on a real-time basis. Thus, it is no longer necessary to give a frame memory a large capacity to store therein sensed-image data acquired under a plurality of sets of conditions.

In the solid-state image-sensing device configured as described above, the operation for acquiring one frame worth of sensed-image data and the operation for acquiring one frame worth of noise data may be performed alternately.

Alternatively, in the solid-state image-sensing device configured as described above, the operation for acquiring a plurality of frames worth of sensed-image data and the operation for acquiring one frame worth or a plurality of frames worth of noise data may be performed alternately.

The solid-state image-sensing device configured as described above may be provided with, as the pixel circuit, a plurality of such pixel circuits arrayed in a matrix. In that case, the operation for acquiring one frame worth of sensed-image data and the operation for acquiring one line worth of noise data are performed alternately while the line on which the one line worth of noise data is acquired is varied sequentially and, after noise data on all lines of one frame are acquired, based on the noise data on all the lines, one frame worth of noise data are generated. This permits image sensing at a higher frame rate than when the operation for acquiring one frame worth of sensed-image data and the operation for acquiring one frame worth of noise data are performed alternately, and permits acquisition of noise data without loss of frames as occurs when the operation for acquiring a plurality of frames worth of sensed-image data and the operation for acquiring one frame worth or a plurality of frames worth of noise data are performed alternately.

Alternatively, the solid-state image-sensing device configured as described above may be provided with, as the pixel circuit, a plurality of such pixel circuits arrayed in an n-row, m-column matrix (where n and m are natural numbers). In this case, after one frame worth of sensed-image data are acquired, first, sensed-image data on line k (where k is a natural number fulfilling 1≦k≦n) are read out, then noise data on line k only is acquired, then the operation for reading one frame worth of data sequentially from line 1 is repeated while the value of k is varied sequentially, and, after noise data on all lines of one frame are acquired, based on the noise data on all the lines, one frame worth of noise data are generated. Thus, as compared with when no noise data is acquired, the only increase in the length of time for which exposure cannot be performed is the period for reading out the one line worth of sensed-image data on line k plus the period for acquiring the one line worth of noise data on line k. This helps minimize dead time.

In the above sequence of operations, after one frame worth of sensed-image data are acquired, first, sensed-image data on line k (where k is a natural number fulfilling 1≦k≦n) are read out, then noise data on line k only is acquired, and then the operation for reading one frame worth of data sequentially from line 1 is performed, for example, as follows: if k=1, one line worth of data read out for the first time are assigned to line 1 of generated sensed-image data, one line worth of data read out for the second time are assigned to line 1 of the generated noise data, and one line worth of data read out for the third time to one line worth of data read out for the (n+1)-th time are assigned sequentially to lines 2 to n of the generated sensed-image data; if k=2≦k≦n−1, one line worth of data read out for the first time are assigned to line k of the generated sensed-image data, one line worth of data read out for the second time to one line worth of data read out for the k-th time are assigned sequentially to lines 1 to (k−1) of the generated sensed-image data, one line worth of data read out for the (k+1)-th time are assigned to line k of the generated noise data, and one line worth of data read out for the (k+2)-th time to one line worth of data read out for the (n+1)-th time are assigned sequentially to lines (k+1) to n of the generated sensed-image data; and if k=n, one line worth of data read out for the first time are assigned to line n of the generated sensed-image data, one line worth of data read out for the second time to one line worth of data read out for the n-th time are assigned to lines 1 to (n−1) of the generated sensed-image data, and one line worth of data read out for the (n+1)-th time are assigned to line n of the generated noise data.

DETAILED DESCRIPTION OF PREFERRED EMBODIMENTS

Figure 1:
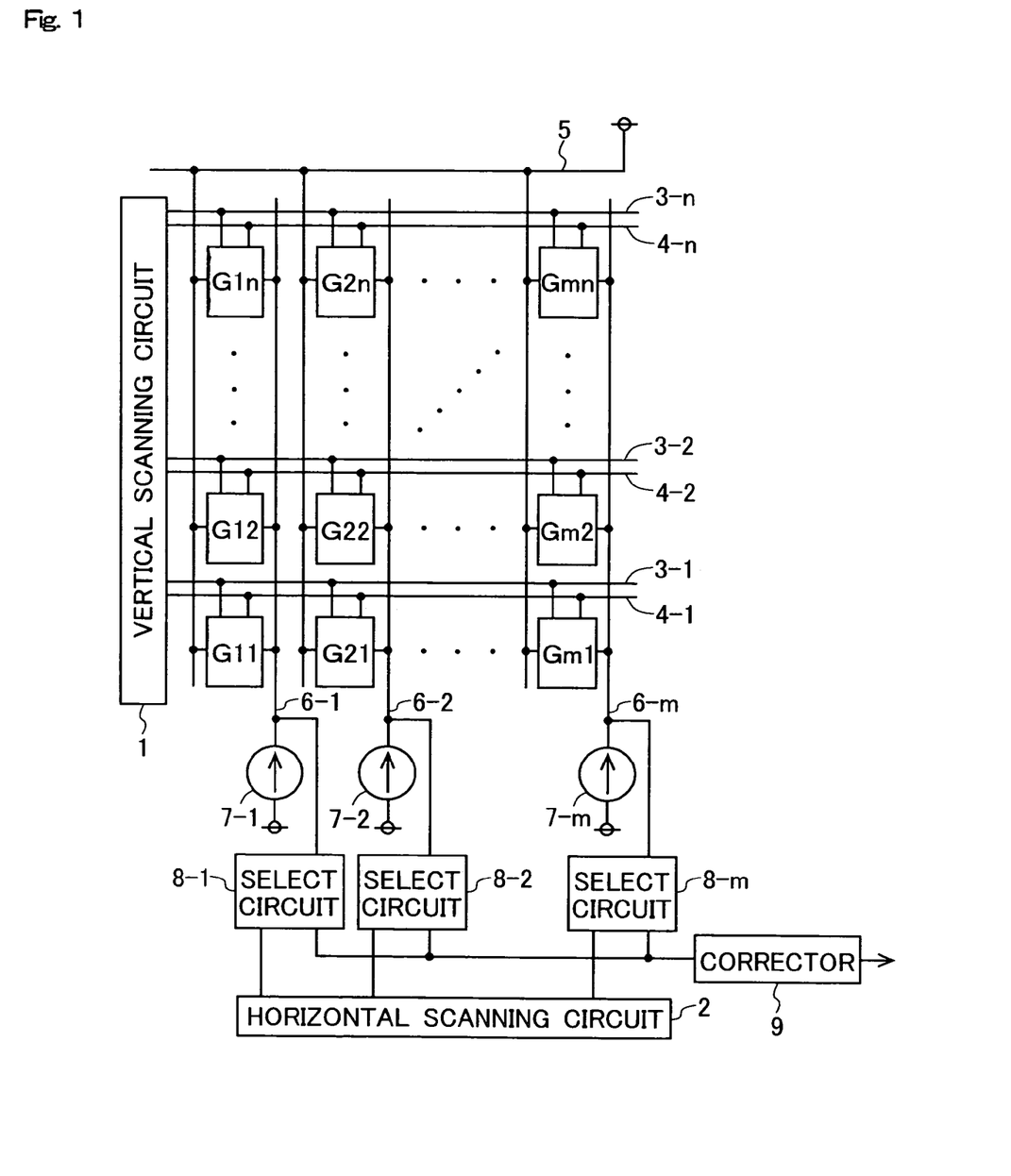
FIG. 1 is a diagram showing an example of the configuration of a solid-state image-sensing device according to the present invention.

Embodiments of the present invention will be described below with reference to the accompanying drawings. An example of the configuration of a solid-state image-sensing device according to the present invention is shown in FIG. 1. FIG. 1 shows the following. Reference numerals G11 to Gmn represent pixels that are arrayed in rows and columns (in a matrix). Reference numeral 1 represents a vertical scanning circuit that sequentially scans rows (lines) 3-1, 3-2, . . . , and 3-n, via which a signal φV is fed to the pixels, and meanwhile feeds a signal φVD to the pixels via lines 4-1, 4-2, . . . , and, 4-n. Reference numeral 2 represents a horizontal scanning circuit that sequentially reads out, pixel by pixel in the horizontal direction, the photoelectric conversion signals delivered from the pixels to output signal lines 6-1, 6-2, . . . , and 6-m. Reference numeral 5 represents a supply voltage line. In reality, not only the lines 3-1 to 3-n and 4-1 to 4-n, the output signal lines 6-1 to 6-m, and the supply power line 5 mentioned above, but other lines (for example, clock lines and bias supply lines) are also connected to the pixels; in FIG. 1, however, these other lines are omitted.

Constant-current sources 7-1 to 7-m are connected, one-to-one, to the output signal lines 6-1 to 6-m, and select circuits 8-1 to 8-m are provided that sample and hold sensed-image data and noise data fed thereto via the output signal lines 6-1 to 6-m from the pixels G11 to Gmn.

The sensed-image data and noise data outputted from the pixel Gab (where "a" is a natural number fulfilling 1≦a≦m, and "b" is a natural number fulfilling 1≦b≦n) are outputted via the output signal line 6-a, are then amplified by the constant-current source 7-a connected to that output signal line 6-a, and are then fed, as sensed-image data and noise data, to the select circuit 8-a. The sensed-image data and noise data is then sampled and held by the select circuit 8-a. The sensed-image data and noise data sampled and held by the select circuit 8-a are then fed to a corrector 9. The corrector 9 has a frame memory for storing the sensed-image data and noise data and, by calculating the differences between the sensed-image data fed from the select circuits 8-1 to 8-m and the noise data fed from the select circuits 8-1 to 8-m, cancels variations among the pixels resulting from variations in the threshold voltage of the logarithmic conversion MOS transistor thereof. The procedure for reading out the sensed-image data and noise data mentioned above and the procedure for calculating the differences between the sensed-image data and noise data will be described later.

Although not illustrated in FIG. 1, the vertical scanning circuit 1 and the horizontal scanning circuit 2 are connected to a timing generator and a voltage regulator, respectively, to achieve vertical and horizontal scanning. Moreover, although not illustrated in FIG. 1, the solid-state image-sensing device shown in FIG. 1 is provided with a signal controller that controls the voltage levels of the signals fed to the pixels.

Figure 2:
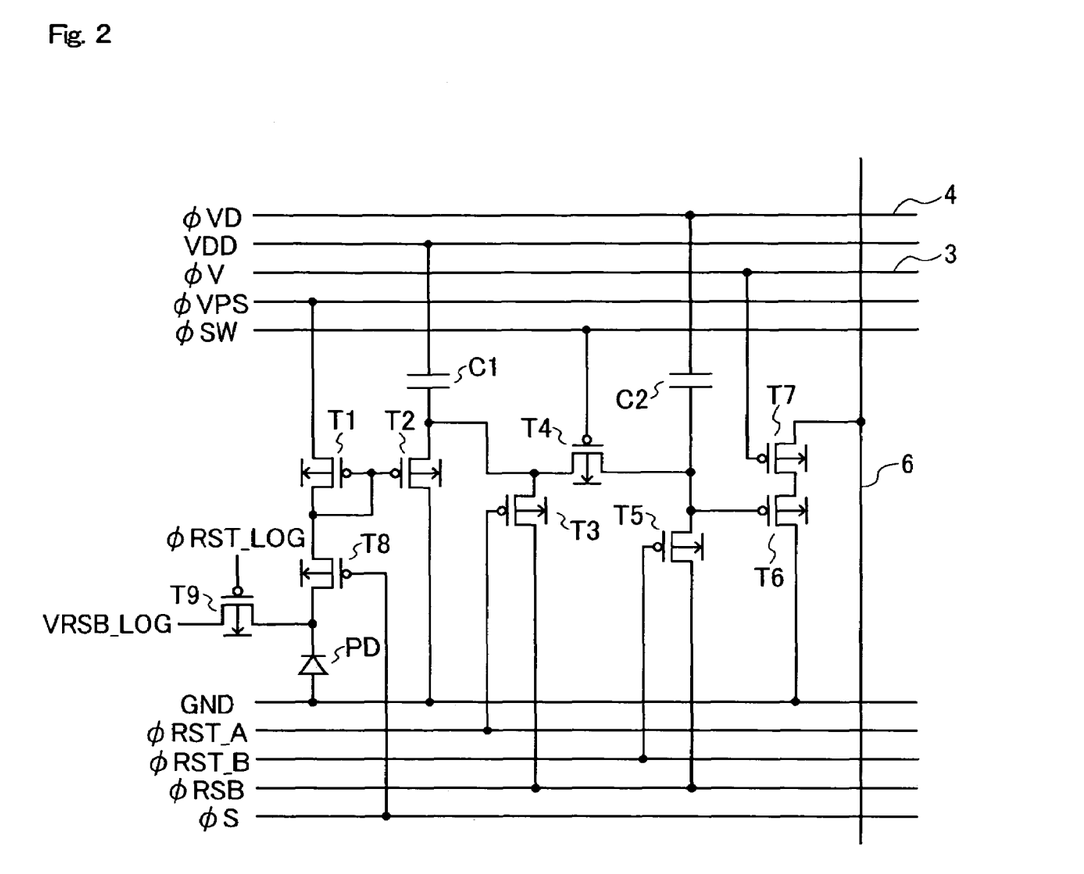
FIG. 2 is a diagram showing the configuration of the pixel circuit of the solid-state image-sensing device shown in FIG. 1.

The configuration of the pixel circuit of the solid-state image-sensing device shown in FIG. 1 is shown in FIG. 2. The pixel circuit shown in FIG. 2 is composed of a PN-junction photodiode PD, a logarithmic conversion MOS transistor T1, an integrating MOS transistor T2, a first capacitor C1, a first reset MOS transistor T3, a capacitance division MOS transistor T4, a second capacitor C2, a second reset MOS transistor T5, an amplification MOS transistor T6, a selection MOS transistor T7, a photoelectric converter disconnection MOS transistor T8, and a forcible reset MOS transistor T9.

The PN-junction photodiode PD serves as a photoelectric converter, and its cathode is connected via the photoelectric converter disconnection MOS transistor T8 to the gate and drain of the logarithmic conversion MOS transistor T1 and to the gate of the integrating MOS transistor T2. A signal φVPS is fed to the source of the logarithmic conversion MOS transistor T1. A direct-current voltage GND is applied to the anode of the PN-junction photodiode PD. A signal φS is fed to the gate of the photoelectric converter disconnection MOS transistor T8.

The source of the forcible reset MOS transistor T9 is connected to the node between the PN-junction photodiode PD and the photoelectric converter disconnection MOS transistor T8. A signal φRST_LOG is fed to the gate of the forcible reset MOS transistor T9. A direct-current voltage VRSB_LOG, which is a low voltage, is applied to the drain of the forcible reset MOS transistor T9.

A direct-current voltage VDD is applied to one end of the first capacitor C1, and the other end of the first capacitor C1 is connected to the source of the integrating MOS transistor T2, to the drain of the first reset MOS transistor T3, and to the drain of the capacitance division MOS transistor T4. The direct-current voltage GND is applied to the drain of the integrating MOS transistor T2. A signal φRST_A is fed to the gate of the first reset MOS transistor T3, and a signal φRSB is fed to the source of the first reset MOS transistor T3. A signal φSW is fed to the gate of the capacitance division MOS transistor T4.

Via a line 4, a signal φVD is fed to one end of the second capacitor C2, and the other end of the second capacitor C2 is connected to the source of the capacitance division MOS transistor T4, to the drain of the second reset MOS transistor T5, and to the gate of the amplification MOS transistor T6. The drain of the selection MOS transistor T7 is connected to the source of the amplification MOS transistor T6, and the source of the selection MOS transistor T7 is connected to an output signal line 6. A signal φRST_B is fed to the gate of the second reset MOS transistor T5, and the signal φRSB is fed to the source of the second reset MOS transistor T5. The direct-current voltage GND is applied to the drain of the amplification MOS transistor T6. Via a line 3, a signal φV is fed to the gate of the selection MOS transistor T7.

In the solid-state image-sensing device shown in FIG. 1, an exposure period starts at the same time and ends at the same time for all the pixels, so that image sensing is started at the same time and is ended at the same time for all the pixels. Specifically, for all the pixels, the time at which the resetting of the first capacitor C1 ends, that is, the time at which the exposure period within a frame period starts, is made coincident, and the time at which the capacity division between the first and second capacitors C1 and C2 ends, that is, the time at which the exposure period within the frame period ends, is made coincident. In this way, shuttering is performed simultaneously for all the pixels.

Figure 3:
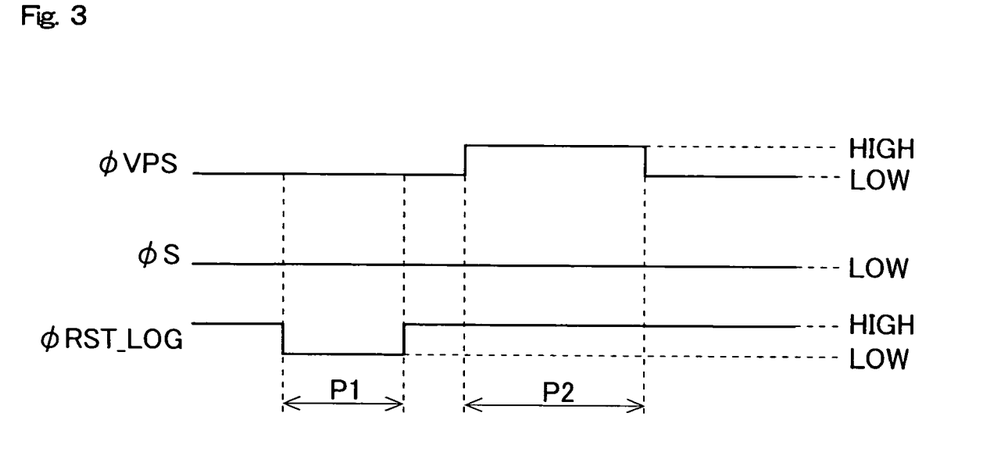
FIG. 3 is a timing chart showing the behavior of the signals fed to the pixel circuit when sensed-image data is acquired.
Figure 4:
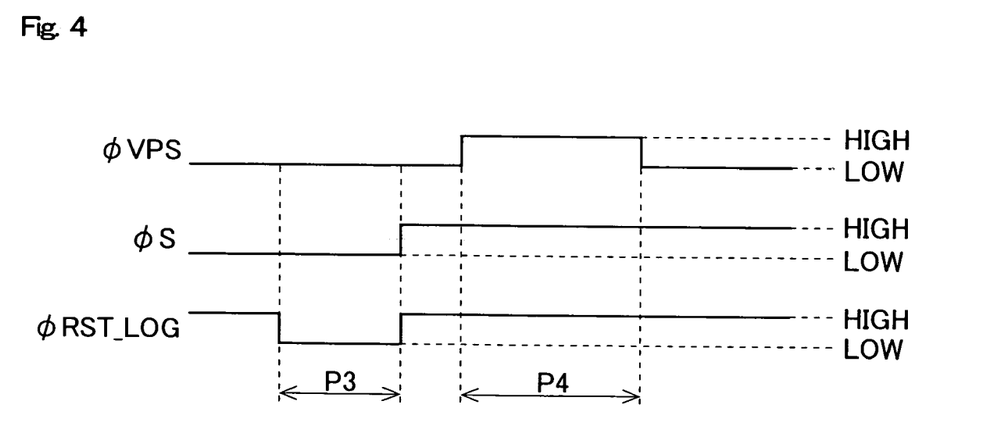
FIG. 4 is a timing chart showing the behavior of the signals fed to the pixel circuit when noise data is acquired.

Now, an outline of the sequence of operations performed in each pixel of the solid-state image-sensing device shown in FIG. 1 to acquire sensed-image data and noise data will be described with reference to the timing charts shown in FIGS. 3 and 4. FIG. 3 is a timing chart showing the behavior of the signals fed to the pixel circuit when sensed-image data is acquired, and FIG. 4 is a timing chart showing the behavior of the signals fed to the pixel circuit when noise data is acquired. It should be noted that no description will be given of such aspects of drive pulse timing as are irrelevant to the features of the present invention.

First, a description will be given of the operations performed to acquire sensed-image data. During acquisition of sensed-image data, the signal φS, which controls the photoelectric converter disconnection MOS transistor T8, is kept at L level (the logically low level). Thus, during acquisition of sensed-image data, the PN-junction photodiode PD remains electrically connected to the logarithmic conversion MOS transistor T1. The signal φRST_LOG is turned to L level to turn the forcible reset MOS transistor T9 on, so that the PN-junction photodiode PD and the logarithmic conversion MOS transistor T1 are reset to a low voltage (the direct-current voltage VRSB_LOG) (period P1 in FIG. 3). Subsequently, the signal φRST_LOG is turned back to H level (the logically high level) to turn the forcible reset MOS transistor T9 off, so that the signal φVPS turns to H level and thus the source voltage of the logarithmic conversion MOS transistor T1 becomes high. This resets the gate and drain of the logarithmic conversion MOS transistor T1 and the gate of the integrating MOS transistor T2 to an image-sensing start level commensurate with the variation in the threshold voltage of the logarithmic conversion MOS transistor T1 (period P2 in FIG. 3). During period P2 shown in FIG. 3, the first reset MOS transistor T3 is turned on to turn the capacitance division MOS transistor T4 off, so that the first capacitor C1 is reset.

Since what is performed hereafter is ordinary image sensing, the following description makes no explanation of drive pulse timing but concentrates on an outline of the operations performed. When the first reset MOS transistor T3 is off and the capacitance division MOS transistor T4 is off, a photoelectric current commensurate with the amount of incident light appears in the PN-junction photodiode PD, and this photoelectric current flows into the logarithmic conversion MOS transistor T1. As a result, a voltage that results from logarithmic conversion of the photoelectric current appears at the gate of the logarithmic conversion MOS transistor T1. Since the gate of the logarithmic conversion MOS transistor T1 is connected to the gate of the integrating MOS transistor T2, negative electric charge flows via the integrating MOS transistor T2 into the first capacitor C1, which then holds the negative electric charge. Thus, the voltage that appears at the node between the first capacitor C1 and the integrating MOS transistor T2 has a level proportional to the integral of the amount of incident light.

The capacitance division MOS transistor T4 is turned on, and the second reset MOS transistor T5 is turned off. This achieves capacitance division between the first and second capacitors C1 and C2. As a result, the data (here, sensed-image data) held in the first capacitor C1 is transferred to the second capacitor C2. Subsequently, the capacitance division MOS transistor T4 is turned off.

Since the second capacitor C2 is connected to the gate of the amplification MOS transistor T6, the amplification MOS transistor T6 outputs a voltage commensurate with the electric charge held in the second capacitor C2. Thus, the voltage outputted from the amplification MOS transistor T6 has a level that is commensurate with the amount of light incident on the PN-junction photodiode PD and that simultaneously reflects the variation in the threshold voltage of the logarithmic conversion MOS transistor T1. When the selection MOS transistor T7 is turned on, the voltage outputted from the amplification MOS transistor T6 is, as data (here, sensed-image data), read out of the pixel via a signal output line 6.

After the completion of the reading of the data (here, sensed-image data), the second reset MOS transistor T5 is turned on, so that the second capacitor C2 is reset.

Next, a description will be given of the operations performed to acquire noise data. For acquisition of noise data, first, the signal φS is turned to L level, so that the PN-junction photodiode PD is electrically connected to the logarithmic conversion MOS transistor T1. Then, in this state, the signal φRST_LOG is turned to L level to turn the forcible reset MOS transistor T9 on, so that the PN-junction photodiode PD and the logarithmic conversion MOS transistor T1 are reset to a low voltage (the direct-current voltage VRSB_LOG) (period P3 in FIG. 4). Subsequently, the signal φRST_LOG is turned back to H level to turn the forcible reset MOS transistor T9 off, and the signal φS is turned to H level to electrically disconnect the PN-junction photodiode PD from the logarithmic conversion MOS transistor T1. Then, in this state, the signal φVPS is turned to H level to make the source voltage of the logarithmic conversion MOS transistor T1 high, so that the gate and drain of the logarithmic conversion MOS transistor T1 and the gate of the integrating MOS transistor T2 are reset to an image sensing start level commensurate with the variation in the threshold voltage of the logarithmic conversion MOS transistor T1 (period P4 in FIG. 4).

What is performed hereafter is ordinary image sensing. The voltage outputted from the amplification MOS transistor T6 has a level that is unrelated to the amount of light incident on the PN-junction photodiode PD but that reflects the variation in the threshold voltage of the logarithmic conversion MOS transistor T1. When the selection MOS transistor T7 is turned on, that voltage is, as data (here, noise data) read out of the pixel via the signal output line 6.

Next, the procedure for reading out sensed-image data and noise data and the procedure for calculating the differences between the sensed-image data and noise data will be described.

In a first embodiment of the present invention, under the control of the timing generator and the signal controller mentioned above, an operation for acquiring one frame worth of sensed-image data and an operation for acquiring one frame worth of noise data are performed alternately. The noise data used for difference calculation may be updated every time one frame worth of noise data is acquired, or may be generated by averaging a plurality of frames worth of noise data.

In a second embodiment of the present invention, under the control of the timing generator and the signal controller mentioned above, an operation for acquiring a plurality of frames worth of sensed-image data and an operation for acquiring one frame worth or a plurality of frames worth of noise data are performed alternately. The combination of the number of frames of sensed-image data and the number of frames of noise data may be fixed, or may be varied according to variation in an environmental condition such as temperature, or may be freely set by user operation.

By providing a sensor for detecting variation in an environmental condition (for example, a temperature sensor), and making the above-mentioned signal controller perform control according to the output of the sensor, it is possible to vary the combination of the number of frames of sensed-image data and the number of frames of noise data according to variation in an environmental condition such as temperature. By providing an input section for accepting information on the combination of the number of frames of sensed-image data and the number of frames of noise data, and making the above-mentioned signal controller perform control according to the information, it is possible to freely set the combination of the number of frames of sensed-image data and the number of frames of noise data by user operation.

In a third embodiment of the present invention, under the control of the timing generator and the signal controller mentioned above, an operation for acquiring one frame worth of sensed-image data and an operation for acquiring one line worth of noise data are performed alternately, and meanwhile the line on which the one line worth of noise data are acquired is sequentially varied. Then, after noise data on all lines of one frame are acquired, based on the noise data on all the lines as stored in a frame memory, one frame worth of noise data are generated.

For example, the sensed-image data of a first frame is read out, then the noise data of only a first line thereof is read out, then the sensed-image data of a second frame is read out, then the noise data of only a second line thereof is read out, and then the sensed-image data of a third frame is read out. For example, in a case where the total number of lines over all the pixels is 480, an operation of reading out the sensed-image data of frame k followed by an operation of reading out the noise data of only line k thereof is repeated 480 times, so that the noise data of lines 1 to 480 are acquired through the processing of 480 frames. The noise data of lines 1 to 480 are then merged into one frame worth of noise data and used for difference calculation. In the third embodiment, image sensing can be performed at a higher frame rate than in the first embodiment, and noise data can be acquired without loss of frames as occurs in the second embodiment.

The procedure for reading out sensed-image data and noise data and the procedure for calculating the differences between the sensed-image data and noise data that will be described below as a fourth embodiment of the present invention are effective in a pixel circuit where exposure and data reading are performed simultaneously (for example, the pixel circuit shown in FIG. 2 and described previously).

Figure 5:
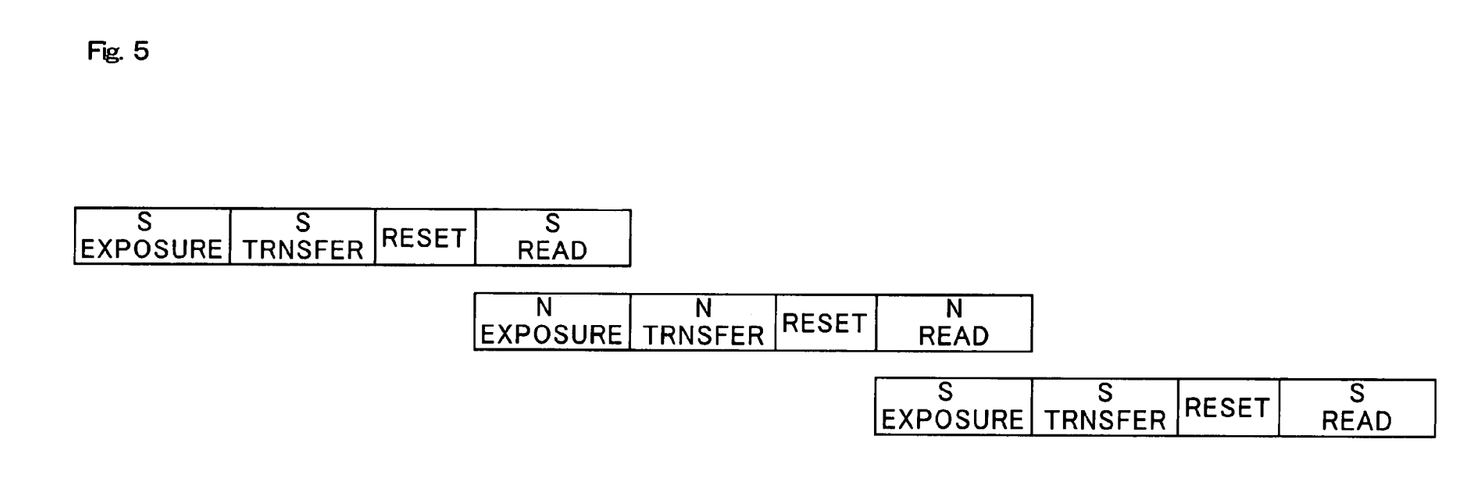
FIG. 5 is a diagram showing the timing with which exposure and data reading are handled by the pixel circuit shown in FIG. 2.

First, with reference to FIG. 5, the timing with which exposure and data reading are handled by the pixel circuit shown in FIG. 2 will be described. As shown in the figure, the following operations are performed sequentially: exposure for sensed-image data; transfer of the sensed-image data from the first capacitor C1 to the second capacitor C2; resetting of the PN-junction photodiode PD and the logarithmic conversion MOS transistor T1; and reading-out of the sensed-image data (including the resetting of the second capacitor C2 after the completion of reading-out). Here, during the reading-out of the sensed-image data, exposure for the next batch of noise data is performed. Subsequently, the following operations are performed sequentially: transfer of the noise data from the first capacitor C1 to the second capacitor C2; resetting of the PN-junction photodiode PD and the logarithmic conversion MOS transistor T1; and reading-out of the noise data (including the resetting of the second capacitor C2 after the completion of reading-out). Here, during the reading-out of the noise data, exposure for the next batch of sensed-image data is performed. Subsequently, the following operations are performed sequentially: transfer of the sensed-image data from the first capacitor C1 to the second capacitor C2; resetting of the PN-junction photodiode PD and the logarithmic conversion MOS transistor T1; and reading-out of the sensed-image data. In this way, during the exposure of one batch of data, the previously sensed batch of data are read out. Thus, if an operation for acquiring one frame worth of sensed-image data and an operation for acquiring one line worth of noise data are performed alternately as in the third embodiment described above, it is necessary to read out one frame worth of sensed-image data during an operation for acquiring one line worth of noise data. This makes it practically impossible to perform image sensing at a high frame rate.

Figure 6:
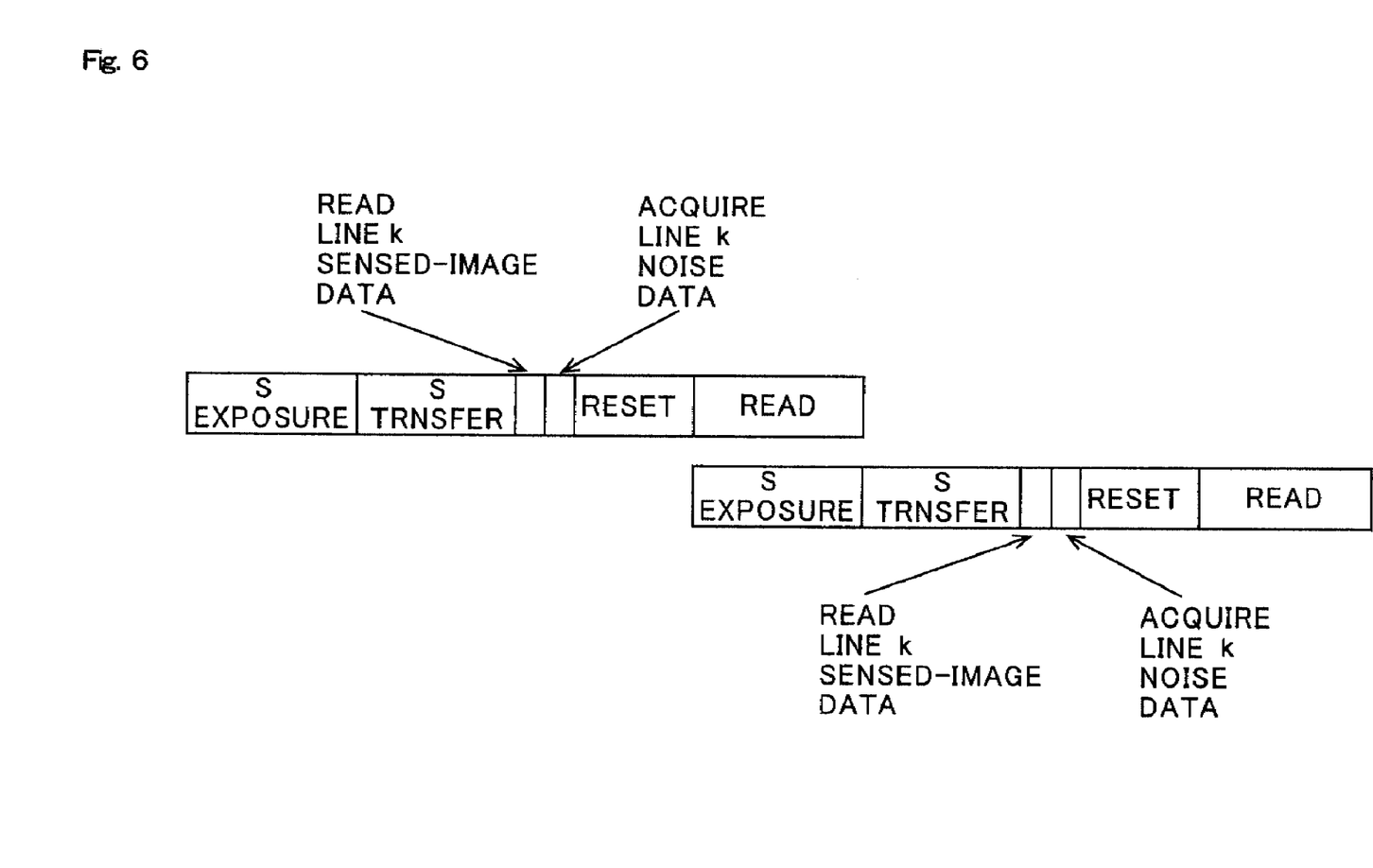
FIG. 6 is a diagram showing the timing with which exposure and data reading are handled in a fourth embodiment of the present invention.

Now the timing with which exposure and data reading are handled in the fourth embodiment will be described with reference to FIG. 6. As shown in the figure, operations proceed as follows. Exposure is performed for sensed-image data, and then the sensed-image data is transferred from the first capacitor C1 to the second capacitor C2. Subsequently, the sensed-image data on line k is read out (including the resetting of the second capacitor C2, on line k only, after the completion of reading-out), then the PN-junction photodiode PD and the logarithmic conversion MOS transistor T1 on line k only are reset, and the noise data on line k only are acquired. Subsequently, the PN-junction photodiode PD and logarithmic conversion MOS transistor T1 are reset sequentially on all the lines, and then the data are read out sequentially on all the lines (including the resetting of the second capacitor C2 after the completion of reading-out). Here, while the data is read out, exposure is performed for the next batch of sensed-image data. During the above reading-out of the data on all the lines, the data are read out sequentially starting with line 1 and, whereas sensed-image data are read out on the lines other than line k, noise data are read out on line k. Thus, as compared with when no noise data is acquired, the only increase in the length of time for which exposure cannot be performed is the period for reading out the one line worth of sensed-image data on line k plus the period for acquiring the one line worth of noise data on line k. This helps minimize dead time. For example, in a case where the total number of lines over all the pixels is 480, by varying k sequentially such that k=1, then 2, then 3, . . . , and then 480, it is possible to acquire the noise data on all the lines on completion of the processing of 480 frames. The noise data of lines 1 to 480 are then merged into one frame worth of noise data and used for difference calculation.

In the above procedure for performing exposure and data reading performed in the fourth embodiment, after one frame worth of sensed-image data are acquired, first, sensed-image data on line k (where k is a natural number fulfilling 1≦k≦n) are read out, then noise data on line k only is acquired, and then, during the operation for reading one frame worth of data sequentially from line 1, the generation of sensed-image data and noise data based on the data thus read out is performed, for example, as follows.

If k=1, one line worth of data read out for the first time are assigned to line 1 of generated sensed-image data, one line worth of data read out for the second time are assigned to line 1 of the generated noise data, and one line worth of data read out for the third time to one line worth of data read out for the (n+1)-th time are assigned sequentially to lines 2 to n of the generated sensed-image data. If k=2≦k≦n−1, one line worth of data read out for the first time are assigned to line k of the generated sensed-image data, one line worth of data read out for the second time to one line worth of data read out for the k-th time are assigned sequentially to lines 1 to (k−1) of the generated sensed-image data, one line worth of data read out for the (k+1)-th time are assigned to line k of the generated noise data, and one line worth of data read out for the (k+2)-th time to one line worth of data read out for the (n+1)-th time are assigned sequentially to lines (k+1) to n of the generated sensed-image data. If k=n, one line worth of data read out for the first time are assigned to line n of the generated sensed-image data, one line worth of data read out for the second time to one line worth of data read out for the n-th time are assigned to lines 1 to (n−1) of the generated sensed-image data, and one line worth of data read out for the (n+1)-th time are assigned to line n of the generated noise data.

What is claimed is:

1. A solid-state image-sensing device comprising:
a pixel circuit,
wherein the pixel circuit comprises:
　a photoelectric converter;
　a logarithmic conversion MOS transistor that logarithmically converts an output of the photoelectric converter, the logarithmic conversion MOS transistor having a gate and a drain thereof short-circuited together;
　a photoelectric converter disconnecting switch that is provided between the photoelectric converter and the logarithmic conversion MOS transistor;
　a forcible reset switch that, when turned on, resets a voltage at a node between the photoelectric converter and the photoelectric converter disconnecting switch; and
　a controller that turns on and off and thereby controls the photoelectric converter disconnecting switch and the forcible reset switch,
wherein, for acquisition of sensed-image data, the photoelectric converter disconnecting switch is turned on to make the forcible reset switch perform resetting, then a voltage at an end of the logarithmic conversion MOS transistor that is not connected to the photoelectric converter disconnecting switch is so controlled that the logarithmic conversion MOS transistor is reset according to a threshold voltage thereof, and then an output commensurate with an amount of light incident on the photoelectric converter is delivered, and
wherein, for acquisition of noise data, the photoelectric converter disconnecting switch is turned on to make the forcible reset switch perform resetting, then the photoelectric converter disconnecting switch is turned off, then the voltage at the end of the logarithmic conversion MOS transistor that is not connected to the photoelectric converter disconnecting switch is so controlled that the logarithmic conversion MOS transistor is reset according to the threshold voltage thereof, and then an output unrelated to the amount of light incident on the photoelectric converter is delivered; and
wherein an operation for acquiring a plurality of frames worth of sensed-image data and an operation for acquiring one frame worth or a plurality of frames worth of noise data are performed alternately.

2. A solid-state image-sensing device comprising:
a pixel circuit,
wherein the pixel circuit comprises:
　a photoelectric converter;
　a logarithmic conversion MOS transistor that logarithmically converts an output of the photoelectric converter, the logarithmic conversion MOS transistor having a gate and a drain thereof short-circuited together;
　a photoelectric converter disconnecting switch that is provided between the photoelectric converter and the logarithmic conversion MOS transistor;
　a forcible reset switch that, when turned on, resets a voltage at a node between the photoelectric converter and the photoelectric converter disconnecting switch; and
　a controller that turns on and off and thereby controls the photoelectric converter disconnecting switch and the forcible reset switch,
wherein, for acquisition of sensed-image data, the photoelectric converter disconnecting switch is turned on to make the forcible reset switch perform resetting, then a voltage at an end of the logarithmic conversion MOS transistor that is not connected to the photoelectric converter disconnecting switch is so controlled that the logarithmic conversion MOS transistor is reset according to a threshold voltage thereof and then an output commensurate with an amount of light incident on the photoelectric converter is delivered, and
wherein, for acquisition of noise data, the photoelectric converter disconnecting switch is turned on to make the forcible reset switch perform resetting, then the photoelectric converter disconnecting switch is turned off, then the voltage at the end of the logarithmic conversion MOS transistor that is not connected to the photoelectric converter disconnecting switch is so controlled that the logarithmic conversion MOS transistor is reset according to the threshold voltage thereof and then an output unrelated to the amount of light incident on the photoelectric converter is delivered;

wherein the solid-state image-sensing device comprises, a pixel circuit, a plurality of such pixel circuits arrayed in a matrix, and wherein an operation for acquiring one frame worth of sensed-image data and an operation for acquiring one line worth of noise data are performed alternately while the line on which the one line worth of noise data is acquired is varied sequentially and, after noise data on all lines of one frame are acquired, based on the noise data on all the lines, one frame worth of noise data are generated.

3. A solid-state image-sensing device comprising:

a pixel circuit, wherein the pixel circuit comprises:

a photoelectric converter;

a logarithmic conversion MOS transistor that logarithmically converts an output of the photoelectric converter, the logarithmic conversion MOS transistor having a gate and a drain thereof short-circuited together;

a photoelectric converter disconnecting switch that is provided between the photoelectric converter and the logarithmic conversion MOS transistor;

a forcible reset switch that, when turned on, resets a voltage at a node between the photoelectric converter and the photoelectric converter disconnecting switch; and a controller that turns on and off and thereby controls the photoelectric converter disconnecting switch and the forcible reset switch, wherein, for acquisition of sensed-image data the photoelectric converter disconnecting switch is turned on to make the forcible reset switch perform resetting, then a voltage at an end of the logarithmic conversion MOS transistor that is not connected to the photoelectric converter disconnecting switch is so controlled that the logarithmic conversion MOS transistor is reset according to a threshold voltage thereof, and then an output commensurate with an amount of light incident on the photoelectric converter is delivered, and wherein, for acquisition of noise data, the photoelectric converter disconnecting switch is turned on to make the forcible reset switch perform resetting, then the photoelectric converter disconnecting switch is turned off, then the voltage at the end of the logarithmic conversion MOS transistor that is not connected to the photoelectric converter disconnecting switch is so controlled that the logarithmic conversion MOS transistor is reset according to the threshold voltage thereof, and then an output unrelated to the amount of light incident on the photoelectric converter is delivered;

wherein the solid-state image-sensing device comprises, a pixel circuit, a plurality of such pixel circuits arrayed in an n-row, m-column matrix (where n and m are natural numbers), and wherein, after one frame worth of sensed-image data are acquired, first sensed-image data on line k (where k is a natural number fulfilling $1 \leq k \leq n$) are read out, then noise data on line k only is acquired, then an operation for reading one frame worth of data sequentially from line 1 is repeated while a value of k is varied sequentially, and, after noise data on all lines of one frame are acquired, based on the noise data on all the lines, one frame worth of noise data are generated; and wherein after one frame worth of sensed-image data are acquired, first, sensed-image data on line k (where k is a natural number fulfilling $1 \leq k \leq n$) are read out, then noise data on line k only is acquired, and then, when the operation for reading one frame worth of data sequentially from line 1 is performed, if $k=1$, one line worth of data read out for a first time are assigned to line 1 of generated sensed-image data, one line worth of data read out for a second time are assigned to line 1 of the generated noise data, and one line worth of data read out for a third time to one line worth of data read out for an (n−1)-th time are assigned sequentially to lines 2 to n of the generated sensed-image data, if $k=2 \leq k \leq n-1$, one line worth of data read out for a first time are assigned to line k of the generated sensed-image data, one line worth of data read out for a second time to one line worth of data read out for a k-th time are assigned sequentially to lines 1 to (k−1) of the generated sensed-image data, one line worth of data read out for a (k+1)-th time are assigned to line k of the generated noise data, and one line worth of data read out for a (k+2)-th time to one line worth of data read out for an (n+1)-th time are assigned sequentially to lines (k+1) to n of the generated sensed-image data, and if $k=n$, one line worth of data read out for a first time are assigned to line n of the generated sensed-image data, one line worth of data read out for a second time to one line worth of data read out for an n-th time are assigned to lines 1 to (n−1) of the generated sensed-image data, and one line worth of data read out for an (n+1)-th time are assigned to line n of the generated noise data.

* * * * *

UNITED STATES PATENT AND TRADEMARK OFFICE
CERTIFICATE OF CORRECTION

PATENT NO. : 7,417,212 B2
APPLICATION NO. : 11/393429
DATED : August 26, 2008
INVENTOR(S) : Tomokazu Kakumoto and Kraisorn Throngnumchai It is certified that error appears in the above-identified patent and that said Letters Patent is hereby corrected as shown below:

Column 12:
line 29, claim 3, delete "(n = 1)-th" and insert -- (n + 1)-th --.

Signed and Sealed this

Twenty-fifth Day of November, 2008

JON W. DUDAS
*Director of the United States Patent and Trademark Office*